United States Patent [19]

Chiang

[11] Patent Number: 5,676,561
[45] Date of Patent: Oct. 14, 1997

[54] EDGE CARD CONNECTOR HAVING GUIDE UNITS WITH SUFFICIENT RESILIENCY

[75] Inventor: Mika Chiang, Taipei Hsien, Taiwan

[73] Assignee: Nextronics Engineering Co., Ltd., Taipei Hsien, Taiwan

[21] Appl. No.: 743,659

[22] Filed: Nov. 5, 1996

[51] Int. Cl.⁶ .................................................. H01R 13/62
[52] U.S. Cl. ...................................... 439/328; 439/157
[58] Field of Search ............................. 439/152–160, 439/372, 326–329

[56] References Cited

U.S. PATENT DOCUMENTS

| | | | |
|---|---|---|---|
| 5,429,523 | 7/1995 | Tondreault | 439/157 |
| 5,445,531 | 8/1995 | Billman et al. | 439/159 |
| 5,470,242 | 11/1995 | Cheng et al. | 439/157 |
| 5,558,528 | 9/1996 | Cheng et al. | 439/160 |

*Primary Examiner*—Hien Vu
*Attorney, Agent, or Firm*—Fish & Richardson, P.C.

[57] ABSTRACT

An edge card connector includes a connector housing having two card guide units with a pair of resilient arms integral with lateral wall sections of the housing and extending upwardly from side walls of the housing in a cantilevered manner so as to define a card-accommodation space therebetween.

5 Claims, 4 Drawing Sheets

EDGE CARD CONNECTOR HAVING GUIDE UNITS WITH SUFFICIENT RESILIENCY

BACKGROUND OF THE INVENTION

1. Field of the Invention

The invention relates to an electrical connector, more particularly to an edge card connector used in a computer and the like for providing an electrical connection between a primary circuit member and an integrated circuit card.

2. Description of the Related Art

Referring to FIGS. 1 and 2, a conventional edge card connector is shown to include an insulative connector housing 11, two eject-and-latch units 12 pivotally and respectively connected to two opposed end portions of the connector housing 11, and a plurality of terminals 13.

As illustrated, the connector housing 11 has an elongated card edge receiving slot 112 which is formed therein and which extends between the opposed end portions thereof, and a plurality of terminal receiving channels 111 which are formed through a bottom of the connector housing 11 and which extend transversely to the receiving slot 112 so as to receive the terminals 13 therein. The connector housing 11 is further provided with a pair of generally U-shaped guide projection units 113, each of which is disposed in-board to and extends uprightly from end portions of two longitudinal side walls of the connector housing 11. Each of the guide projection units 113 defines a vertically insertable passage 114 at a posterior portion thereof in communication with the receiving slot 112 to guide insertion of the integrated circuit card along its lateral side edge so as to receive an edge of the integrated circuit card in the receiving slot 112.

Some of the disadvantages of the aforementioned conventional connector are as follows:

(I) The guide projection units 113 do not provide sufficient resiliency, thereby resulting in untimely disengagement of the inserted integrated circuit card from the receiving slot 112 of the connector housing.

(II) As illustrated in FIG. 2, the integrated circuit card cannot be retained securely in the receiving slot 112 (see FIG. 1) without the assistance of the eject-and-latch units 12.

(III) The intermediate portion 132 of each terminal 13 is provided with an engagement protrusion 134 on only one side thereof so that, after insertion, the intermediation portion 132 is not always positioned stably in the receiving channel 111 and thus may wobble therein, thereby resulting in poor electrical connection between the contact portion of the terminal 13 and the printed contacts (not visible) in the inserted integrated circuit card.

SUMMARY OF THE INVENTION

The object of this invention is to provide an edge card connector which includes two uprightly extending guide projection units with sufficient resiliency so as to clamp two lateral edges of an inserted integrated circuit card, thereby retaining the circuit card stably in a card receiving slot of the connector.

Another object of this invention is to provide a terminal used in the connector such that the terminal provides good electrical connection between a primary circuit board and an integrated circuit card.

Still another object of this invention is to provide an eject-and-latch unit that can be mounted easily into the connector.

Accordingly, the edge card connector of this invention includes an insulative connector housing, a pair of guide units, two eject-and-latch units, and a plurality of terminals. The connector housing has an elongated card edge receiving slot which is formed therein and which has a longitudinal axis. The card edge receiving slot is adapted to receive an integrated circuit card in an electrically operative relationship. The connector housing includes a pair of parallel side walls, and two end walls interposed integrally between the side walls so as to form the housing. Each of the side walls is formed with an end portion from which an upright lateral wall section extends upwardly and cooperates with another one of the upright lateral wall to define a vertically insertable passage of a first width and transverse to the longitudinal axis. Each of the end walls is formed with a vertically extending slot which has a second width transverse to the axis and which is narrower than the first width so as to bifurcate the end wall into a pair of spaced apart upright end wall sections. The end wall sections and the lateral wall sections cooperatively form an L-shaped wall structure. A pair of snap-lock pivot bearings are formed in inner surfaces of lower portions of the end portions of the side walls respectively. Each of the guide units is disposed in-board to and integrally formed with the lateral wall sections and includes a pair of resilient arms that extend upwardly from the side walls in a cantilevered manner so as to define a card-accommodation space therebetween. The resilient arms have inner projections extending respectively from upper parts thereof and toward each other to form a vertical slit therebetween, and two transverse half-barrier walls which are opposite and parallel to a respective one of the end walls so as to confine and guide insertion of the circuit card along a lateral side edge of the same. The vertical slits in the guide projection units are aligned respectively with the vertically extending slots in the end walls in the longitudinal axis so as to impart a desired degree of resiliency to the lateral wall sections and the side walls in a transverse direction of the longitudinal axis. Each of the eject-and-latch units includes an eject lever which has a pair of snap-lock aligned pivot pins disposed on two lateral walls thereof and transversely aligned each other, and upper and lower arms disposed at two sides of the pivot pins. A transverse length between two extremities of the pivot pins is slightly larger than the first width so that insertion of the eject lever downwardly into the vertically insertable passage from above will enable snap-lock engagements between the pivot bearings and the pivot pins respectively. Two extremities of the pivot pins define a transverse length therebetween which is slightly longer than the first width so that insertion of the eject lever downwardly into the vertically insertable passage from above will enable snap-lock engagements between the snap-lock pivot bearings and the snap-lock pivot pins.

The lower arm of the eject lever has a bottom eject foot to abut against a leading edge of the integrated circuit card in a non-ejecting position when the integrated circuit card is fully inserted in the card edge receiving slot of the connector housing.

The upper arm of the eject lever has a finger actuated portion which is in a raised position or in a depressed position when the bottom eject foot is in the non-ejecting position or in an ejecting position. The upper arm of the eject lever has a third width transverse to the longitudinal axis and narrower than the second width so that, when the finger actuated portion is turned to the depressed position, the upper arm of the lever can partially protrude outwardly of the respective one the end walls of the connector housing.

The eject lever further has a pair of aligned stop elements which are formed on the lateral walls of the upper arm and which are located between the finger actuated portion and the pivot pins. The stop elements extend in a direction parallel to the pins and have two extremities that define a length therebetween which is longer than the second width so that the stop elements will abut against the upright end wall sections in order to limit outward turning of the finger actuated portion when the eject lever is moved to the ejecting position.

BRIEF DESCRIPTION OF THE DRAWINGS

Other features and advantages of this invention will become apparent in the following detailed description of the preferred embodiments of this invention, with reference to the accompanying drawings, in which.

DETAILED DESCRIPTION OF THE PREFERRED EMBODIMENTS

Figure 1:
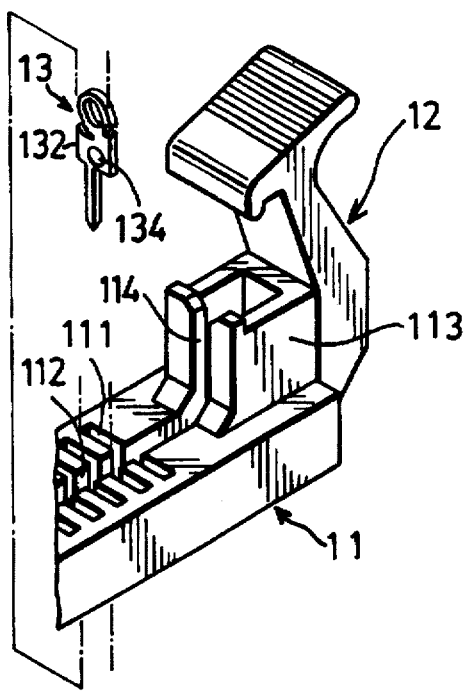
FIG. 1 is a fragmentary perspective view of a conventional electrical connector for providing electrical connection between a primary circuit member and an integrated circuit card.
Figure 2:
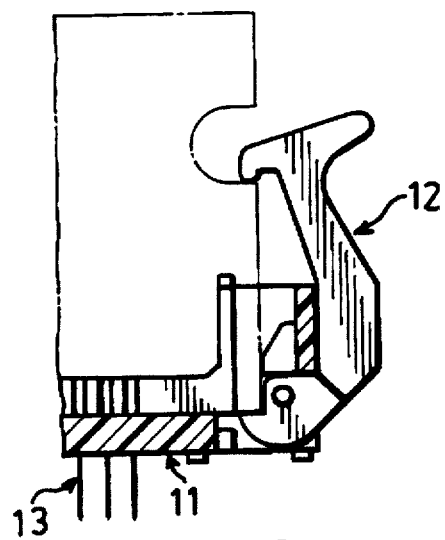
FIG. 2 is a partly sectional view of the conventional electrical connector, illustrating how an integrated circuit card is inserted therein.

Before the present invention is described in greater detail, it should be noted that same reference numerals have been used to denote like elements throughout the disclosure.

Figure 3:
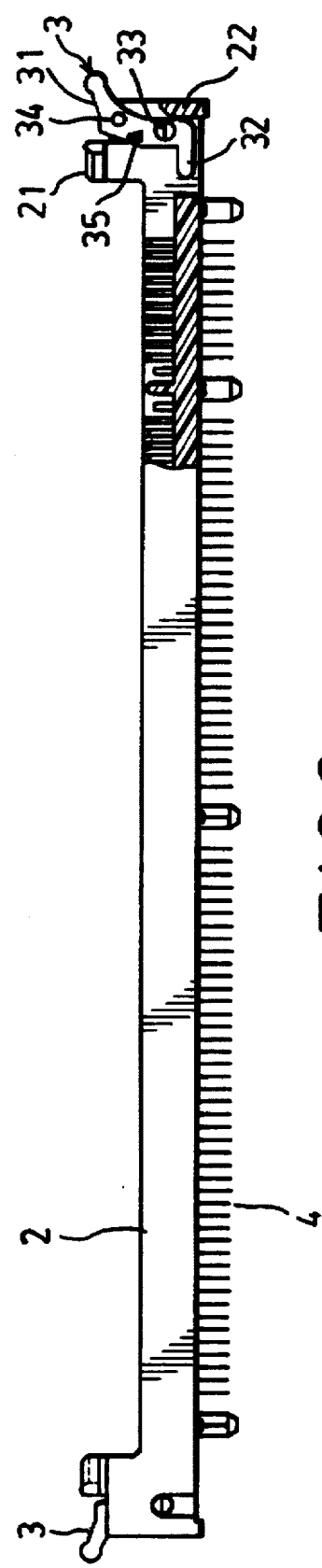
FIG. 3 is a partly sectional view of an edge card connector of this invention.
Figure 4:
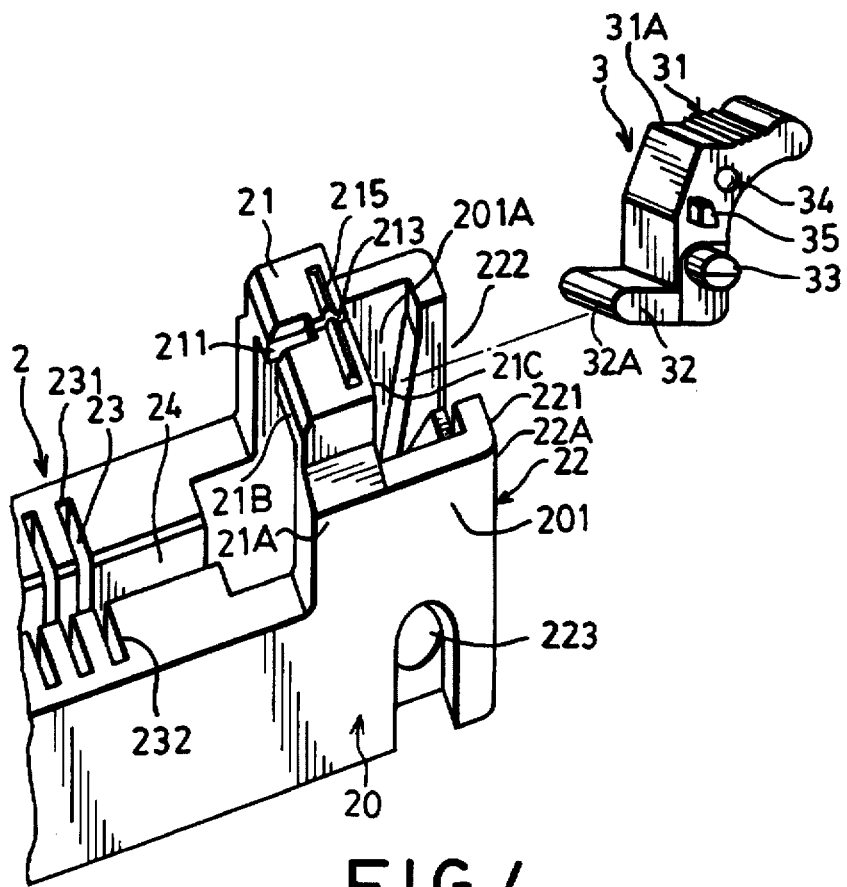
FIG. 4 is a fragmentary perspective view of the edge card connector of this invention.
Figure 5:
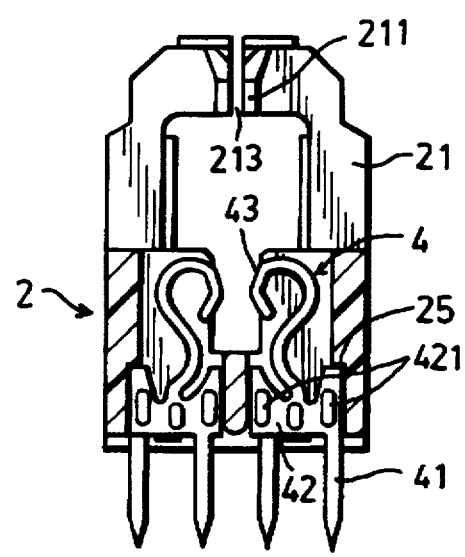
FIG. 5 is cross sectional view of the connector of this invention, illustrating the position of a terminal in the connector.

Referring to FIGS. 3, 4 and 5, an edge card connector of this invention is used for providing electrical connection between a primary circuit member (not visible) and an integrated circuit card (not visible) and includes an insulative connector housing 2, a pair of guide units 21, two eject-and-latch units, and a plurality of terminals 4.

As illustrated, the connector housing 2 has an elongated card edge receiving slot 24 with a longitudinal axis formed therein, and a plurality of terminal receiving channels 23 which are formed through a bottom of the connector housing 2 and which extend transversely to the receiving slot 24 so as to receive the terminals 4 therein. When inserted into the slot 24, the integrated circuit card (not shown) is electrically connected to the primary circuit member via the terminals 4. The connector housing 2 includes a pair of parallel side walls 20, and two end walls 22 interposed integrally between the side walls 20 so as to form the connector housing 2. Each of the side walls 20 is formed with an end portion from which an upright lateral wall section 201 extends upwardly and cooperates with another one of the upright lateral wall 201 to define a vertically insertable passage 201A of a first width and transverse to the axis. Each of the end walls 22 is formed with a vertically extending slot 222 which has a second width transverse to the axis and which is narrower than the first width so as to bifurcate the end wall 22 into a pair of spaced apart upright end wall sections 22A. The end wall sections 22A and the lateral wall sections 201 cooperatively form an L-shaped wall structure. Two downwardly open notches 223 are formed through lower portions in the end portions of the side walls 20 so as to serve as a pair of snap-lock pivot bearings.

Each of the guide units 21 is disposed in-board to and integrally formed with the lateral wall sections 201 and includes a pair of resilient arms 21A that extend upwardly from the side walls 20 in a cantilevered manner so as to define a card-accommodation space 211 therebetween. The resilient arms 21A have inner projections 21B which extend respectively from upper parts thereof and toward each other to form a vertical slit 213 therebetween, and two transverse half-barrier walls 21C which are opposite and parallel to the respective one of the end walls 22 so as to confine and guide insertion of the integrated circuit card (not shown) along a lateral side edge of the same.

Because the vertical slit 213 in the guide projection units 21 are aligned respectively with the vertically extending slots 222 in the end walls 22 in the longitudinal axis, a desired degree of resiliency to the lateral wall sections 201 and the side walls 20 in a transverse direction of the longitudinal axis can be imparted thereto.

In the preferred embodiment, two terminals 4 are inserted in each of the channels 23 in such a manner the terminals 4 are respectively disposed on two sides of the card edge receiving slot 24. Each of the terminals 4 includes an upper contact portion 43 that extends partially into the receiving slot 24 so as to contact a respective contact pad of the integrated circuit card (not shown), a solder portion 41 that extends outwardly from the hole formed through the bottom of the connector housing 2, and an intermediate portion 42 with two vertical edges and opposed side surfaces which are punched respectively so as to form two engagement protrusions 421 respectively on the side surfaces adjacent to the vertical edges. The protrusions 421 extend in parallel and are opposite to each other. Each of the channels 23 is defined by a pair of opposed short inner wall sections 231 respectively located on two sides of the slot 24, and a pair of opposed long inner wall sections 232 which are interposed between the short inner wall sections 231 and which extend transversely to the slot 24. Each of the long inner wall sections 232 on one side of the slot 24 engages the protrusion 421 on a corresponding one of the side surfaces of the intermediate portion 42 so as to dispose the terminal 4 stably in the receiving channel 23.

Each of the eject-and-latch units includes an eject lever 3 which has two snap-lock aligned pivot pins 33 formed on two lateral walls thereof and transversely aligned with each other, and upper and lower arms 31, 32. Two extremities of the pivot pins 33 define a transverse length therebetween. Since the transverse length of the pins 33 is slightly longer than the first width of the passage 201A, the eject lever 3 can be inserted downwardly from above due to an outward expansion of the resilient arms 21A so as to enable snap-lock engagements between the snap-lock pivot bearings and the snap-lock pivot pins 33.

Figure 6:
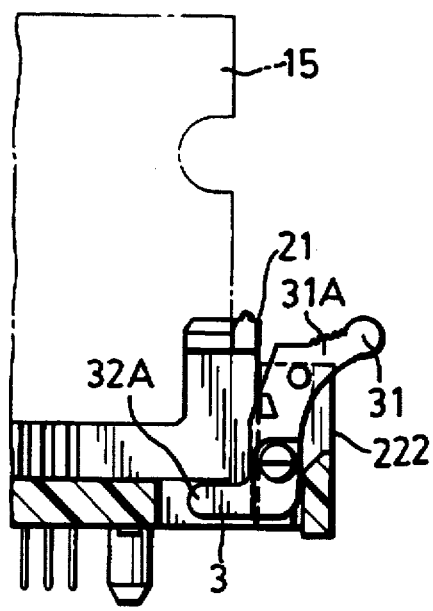
FIG. 6 illustrates the connector of this invention when an integrated circuit card is inserted therein.
Figure 7:
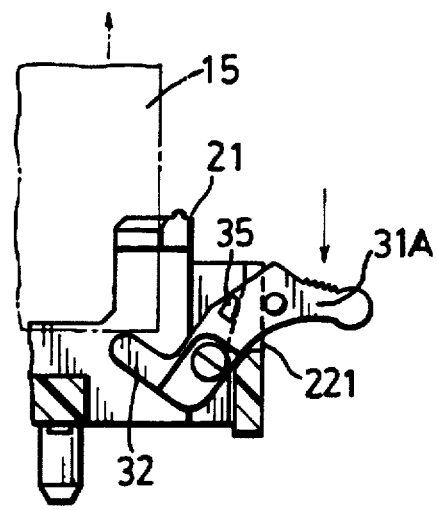
FIG. 7 illustrates the connector of this invention when the integrated circuit card is ejected therefrom.

Referring to FIGS. 6 and 7, the lower arm 32 of the eject lever 3 has a bottom eject foot 32A to abut against a leading edge of the integrated circuit card 15 in a non-ejecting position when the latter is fully inserted in the receiving slot 24 (see FIG. 4) of the connector housing 2. Under this condition, a finger actuated portion 31A in the upper arm 31 is at a raised position. The finger actuated portion 31A of the lever 3, can be depressed as shown by the arrow in FIG. 7, so as to rotate the bottom eject foot 31A about the pivot pins 33 (see FIG. 4), thereby ejecting the integrated circuit card 15 from the connector housing 2 (see FIG. 4). The upper arm 31 of the lever 3 has a third width transverse to the longitudinal axis and narrower than the second width so that, when the finger actuated portion 31A is turned to a depressed position, the upper arm 31 in the eject lever 3 can partially protrude outwardly of the respective one of the end walls 22 (see FIG. 4) of the connector housing 2 (see FIG. 4) via the vertically extending slot 222.

Referring again to FIG. 4, the eject lever 3 further has a pair of aligned stop elements 35 which are formed on the lateral walls of the upper arm 31 and which are located between the finger actuated portion 31A and the pivot pins 33. The stop elements 35 extend in a direction parallel to the pins 33 and have two extremities that define a length therebetween which is longer than the second width. When moved to the ejecting position, the stop elements 35 of the eject lever 3 abut against the inner surfaces of the upright end wall sections 221 (see FIG. 7), thereby limiting outward turning of the finger actuated portion 31A. The eject lever 3 further includes a pair of bump-shaped protrusions 34 formed on the upper arm 31 between the finger actuated portion 31A and the stop elements 35. The bump-shaped protrusions 34 extend transversely in the same direction as that of the stop elements 35 and have a length between two extremities thereof that is slightly longer than the second width so that the upper arm 31 is slidably retained between the upright end wall sections 221 when partially moved out of the vertically extending slot 222.

Figure 8:
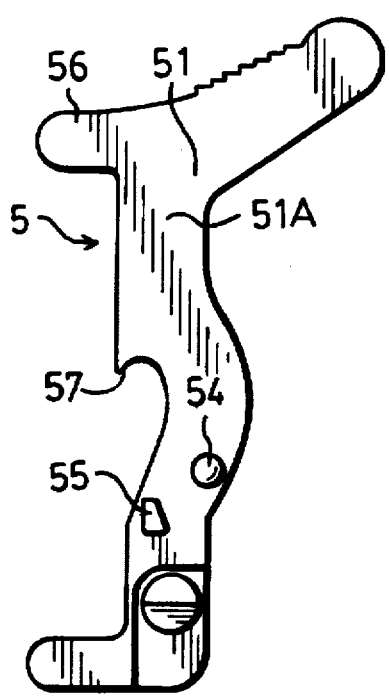
FIG. 8 illustrates a modified eject-and-latch unit employed in the connector of this invention.
Figure 9:
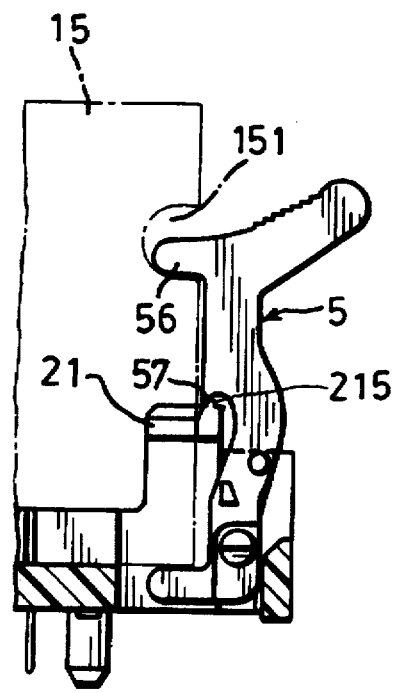
FIG. 9 illustrates the connector of this invention provided with the modified eject-and-latch unit shown in FIG. 8 so as to fasten an inserted integrated circuit card in the connector.

Referring to FIGS. 8 and 9, a modified eject lever 5 according to this invention is shown, wherein the upper arm 51 of the eject lever 5 includes a hook portion 57 disposed between the bump-shaped protrusion 54 and the finger actuated portion 51A and on a side facing a corresponding one of the guide units 21. The connector housing further includes a pair of transverse ridge portions 215 formed on top end sections of the half-barrier walls 21C (see FIG. 4) respectively so as to be hooked by the hook portion 57 to further secure the raised position of the finger actuated portion 51A. The modified eject lever 5 includes a latch member 56 projecting from the finger actuated portion 51A along the direction of the longitudinal axis and is adapted to hook a notch 151 provided on the lateral side edge of an inserted integrated circuit card 15 so as to lock the circuit card 15 in the receiving slot 24 (see FIG. 4) of the connector housing.

With this invention thus explained, it is apparent that numerous modifications and variations can be made without departing from the scope and spirit of this invention. It is therefore intended that this invention be limited only as indicated in the appended claims.

I claim:

1. An edge card connector for providing electrical connection between a primary circuit member and an integrated circuit card, an edge of the circuit card being insertable into and removable from said connector, said connector comprising:

a connector housing having an elongated card edge receiving slot which is formed therein and which has a longitudinal axis, said slot extending between two opposed end portions of said connector housing, and being adapted to receive the edge of the circuit card therein in an electrically operative relationship, the connector housing including:

a pair of parallel side walls, each of said side walls having an end portion from which an upright lateral wall section extends upwardly and cooperates with another one of said upright lateral wall sections to define a vertically insertable passage having a first width and being transverse to said receiving slot;

a pair of end walls, each end wall disposed at a corresponding one of the two opposed end portions of the connector housing, each end wall integrally formed with said side walls and extending transversely between said side walls, each end wall having a pair of end wall sections and a vertically extending slot formed between the end wall sections, said vertically extending slot having a second width, transverse to said longitudinal axis, and narrower than said first width, each of said upright end wall sections and a corresponding one of said upright lateral wall sections cooperatively forming an L-shaped wall structure; and a pair of snap-lock pivot bearings formed in inner surfaces of lower portions of said end portion of said side walls respectively;

a pair of guide units, each guide unit integrally formed with a corresponding one of said lateral wall sections, each of said guide units including a pair of resilient arms which extend upwardly from said side walls in a cantilevered manner so as to define a card-accommodation space therebetween, said resilient arms having inner projections extending respectively from upper parts thereof and toward each other to form a vertical slit therebetween, and two transverse half-barrier walls which are opposite and parallel to a respective one of said end walls so as to confine and guide insertion of said circuit card along a lateral side edge of the circuit card, said vertical slits in said guide units being aligned respectively with said vertically extending slots in said end walls in said longitudinal axis so as to impart a desired degree of resiliency to said lateral wall sections and said side walls in a transverse direction of said longitudinal axis; and a pair of eject-and-latch units, each eject-and-latch unit including an eject lever having:

a pair of snap-lock pivot pins disposed on two lateral walls thereof and transversely aligned with each other, a transverse length between two extremities of said snap-lock pivot pins being slightly longer than said first width so that insertion of said eject lever downwardly into said vertically insertable passage from above will enable snap-look engagements between said snap-look pivot bearings and said snap-lock mounting pins respectively;

an upper arm and a lower arm disposed at two sides of said snap-lock pivot pins, said lower arm having a bottom eject foot disposed on a first free end thereof to abut against a leading edge of the integrated circuit card in its non-ejecting position when the circuit card is fully inserted in said card receiving slot; said upper arm having a finger actuated portion disposed at a second tree end thereof, which is in a raised position or in a depressed position when said bottom eject foot is in the non-ejecting position or in an ejecting position, said upper arm having a third width transverse to said longitudinal axis, and narrower than said second width so that, when said finger actuated portion is turned to said depressed position, said upper arm can partially protrude outwardly of the respective one of said end walls; and a pair of stop projections disposed on said upper arm and between said finger actuated portion and said pivot pins, said stop projections extending in a parallel direction to said snap-lock pivot pins, a length between two extremities of said stop projections being longer than said second width so that said stop projections will abut against internal walls of said upright end wall sections so as to limit outward turning of said finger actuated portion when said eject lever is moved to the ejecting position.

2. The edge card connector according to claim 1, wherein said upper arm of said eject lever further includes a pair of bump-shaped protrusions formed thereon between said finger actuated portion and said stop elements, said bump-shaped protrusions extending transversely in a direction parallel to that of said stop elements and having a length between two extremities thereof which is slightly longer than said second width so that said upper portion is slidably retained between said upright end wall sections when partially moved out of said vertically extending slot.

3. The edge card connector according to claim 2, wherein said upper arm of said eject lever further includes a hook portion disposed between said bump-shaped protrusion and said finger actuated portion and on a side facing a corresponding one of said guide units, said connector housing further including a pair of transverse ridge portions formed on top end sections of said half-barrier walls respectively so as to be hooked by said hook portion to further secure the raised position of said finger actuating unit.

4. The edge card connector according to claim 3, wherein said eject lever includes a latch member extending from said finger actuated portion in a direction transverse to said snap-lock pivot pins, and adapted to hook a notch provided on the lateral side edge of the integrated circuit card so as to lock the circuit card in said receiving slot.

5. The edge card connector according to claim 1, further comprising a plurality of terminals each of which includes an intermediate portion with two vertical edges and two opposed side surfaces which are punched so as to form two engagement protrusions respectively on said side surfaces adjacent to said edges and extending in parallel directions opposite to each other, said connector housing including a plurality of terminal receiving channels which are formed through a bottom of said connector housing and which extend transversely to said receiving slot so as to receive said terminals therein, each of said channels being defined by a pair of opposed short inner wall sections respectively located on two sides of said receiving slot, and a pair of opposed long inner wall sections interposed between said short inner wall sections and extending transversely to said receiving slot, each of said long inner wall sections engaging said protrusion on a corresponding one of said side surfaces so as to dispose said terminal stably in said receiving channel.

* * * * *